United States Patent [19]

Kuo et al.

[11] Patent Number: 5,475,251
[45] Date of Patent: Dec. 12, 1995

[54] SECURE NON-VOLATILE MEMORY CELL

[75] Inventors: Max C. Kuo, Daly City; James M. Jaffe, Santa Clara, both of Calif.

[73] Assignee: National Semiconductor Corporation, Santa Clara, Calif.

[21] Appl. No.: 251,230

[22] Filed: May 31, 1994

[51] Int. Cl.⁶ ............................................. H01L 29/788
[52] U.S. Cl. ..................... 287/316; 257/317; 257/324; 257/325; 257/618; 257/638; 257/640; 257/907
[58] Field of Search ............................. 257/316, 907, 257/317, 324, 325, 618, 638, 640

[56] References Cited

U.S. PATENT DOCUMENTS

| | | |
|---|---|---|
| 4,030,952 | 6/1977 | Luce et al. . |
| 5,030,796 | 7/1991 | Swanson et al. . |
| 5,070,386 | 12/1991 | Imura . |
| 5,109,267 | 4/1992 | Koblinger et al. . |
| 5,231,299 | 7/1993 | Ning et al. ............................. 257/316 |
| 5,308,682 | 5/1994 | Morikawa . |
| 5,337,274 | 8/1994 | Ohji ....................................... 257/316 |

FOREIGN PATENT DOCUMENTS

61-51950  3/1986  Japan .
63-170944  7/1988  Japan .

*Primary Examiner*—Edward Wojciechowicz
*Attorney, Agent, or Firm*—Skjerven, Morrill, MacPherson, Franklin & Friel; William L. Paradice, III

[57] ABSTRACT

An improved EEPROM cell structure is disclosed which provides protection against external detection of data stored within the cell. One or more cavities filled with a high etching film and extending in a substantially vertical direction are provided in a region adjacent to an end of the floating gate such that during an attempted deprocessing of the cell using an etching process, the etchant will rapidly diffuse through these cavities and expose the floating gate via these cavities before exposing and removing the control gate via the insulating layers overlapping the control gate. Any charge once present on the floating gate will dissipate before the control gate can be removed, thereby making it impossible to read data stored within the cell. In another embodiment, a sliver region of the floating gate extends laterally beyond the end of the control gate such that any etchant reaching the control gate will expose the sliver region prior to etching through the control gate, thereby discharging the floating gate before the control gate is removed.

19 Claims, 6 Drawing Sheets

SECURE NON-VOLATILE MEMORY CELL

CROSS REFERENCES TO RELATED APPLICATIONS

This application is related to the U.S. patent application Ser. No. 08/096,537 entitled "TAMPER RESISTANT CIRCUIT STRUCTURE" and U.S. patent application Ser. No. 08/096,153 entitled "STRUCTURES FOR PREVENTING REVERSE ENGINEERING OF INTEGRATED CIRCUITS", both filed on Jul. 22, 1993.

1. Field of the Invention

The present invention relates to memory devices. More particularly, the present invention relates to an improved EEPROM cell structure which prevents detection of data stored within the memory cell.

2. Background of the Invention

Electrically erasable memory (EEPROM) cells store binary data in the form of charge accumulation on a floating gate. EEPROMs are able to change between binary states by transferring charge between the drain and the floating gate by way of electron tunneling. This tunneling allows EEPROMs to be electrically programmable, erasable, and readable by the selective application of potential across the control gate, the drain, and the source.

Figure 1:
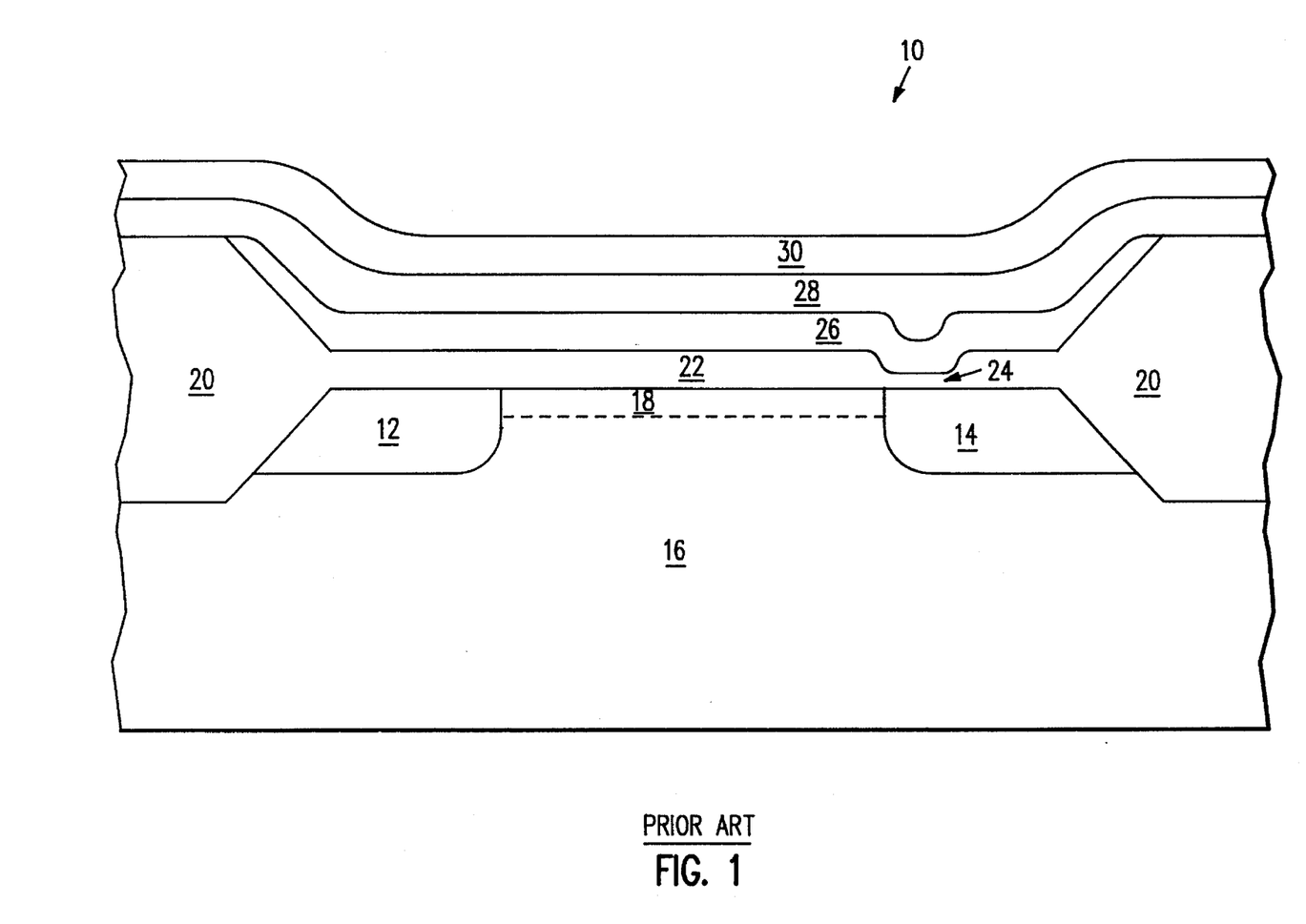
FIG. 1 is a cross sectional view of a typical prior art EEPROM cell.

A typical prior art EEPROM cell is shown and described in U.S. Pat. No. 4,377,857 to Tickle. Such a prior art EEPROM cell is shown in FIG. 1. Cell 10 has source 12 and drain 14 regions formed in silicon substrate 16. Channel region 18 extends between source 12 and drain 14. Substrate 16 is of a conductivity type opposite to that of source 12 and drain 14. Field oxide 20 is provided to insulate cell 10 from adjacent cells (not shown). Gate oxide 22 insulates polycrystalline floating gate 26 from substrate 16 and channel 18. A very thin layer of tunnel oxide 24 insulates a portion of floating gate 26 from drain 14 and allows for the tunneling of electrons between floating gate 26 and drain 14. Insulating layer 28 insulates control gate 30 from floating gate 26.

Binary data is represented in the structure of FIG. 1 by the presence or absence of charge stored on floating gate 26. Data stored in cell 10 is normally read by applying a read voltage to cell 10 and monitoring any current flow between source 12 and drain 14. Where the stored data is highly sensitive or confidential, internal access to cell 10 may be inhibited via security circuitry such that only authorized persons are able to read the contents of cell 10.

However, data stored in cell 10 may also be read externally by deprocessing cell 10 and directly ascertaining whether any charge is present on floating gate 26. For instance, control gate 30 of cell 10 can be removed via mechanical grinding, plasma etching, or chemical etching (or any other well known deprocessing technique), thereby allowing one to directly determine whether charge is present on floating gate 26 and hence to determine the binary state of cell 10.

The susceptibility of data stored in prior art EEPROM cell 10 to external detection compromises the security of systems which use cell 10 as a memory element. Thus, there is a need for an EEPROM cell which provides a heightened security against external detection of data stored within the cell. In particular, there is a need for an EEPROM cell suitable for use in high security systems which renders cell deprocessing ineffective for floating gate charge detection.

SUMMARY

An improved EEPROM cell structure is disclosed which provides protection against external detection of charge stored within the cell by causing any stored charge to dissipate upon an attempted deprocessing of the cell. In one embodiment of the present invention, a sliver region is provided at the end of the floating gate and extends laterally beyond the end of the control gate. This sliver region feature enhances security of the cell as follows. In order to gain access to and determine the binary state of the floating gate, the control gate must first be removed using, for example, a plasma or chemical deprocessing etchant. Since this sliver region extends just beyond the control gate and is covered only by a thin insulation layer (after removal of overlying glass layers), any etchant reaching the control gate will simultaneously attack the thin layer and expose the sliver region of the floating gate prior to etching through the control gate. Since etchants used to deprocess semiconductor cells necessarily contain ions, exposure of the floating gate to such an etchant will cause any charge stored on the floating gate to dissipate. Thus, any charge once present on the floating gate will have been dissipated before the control gate can be removed, thereby making it impossible to determine the correct binary state of the cell prior to the attempted deprocessing.

In another embodiment of the present invention, one or more cavities extending in a substantially vertical direction are positioned in a region adjacent to the floating gate and the control gate. These cavities, which are filled with a film having a high etching rate, enhance the security of the cell as follows. During such an etching process, the etchant will simultaneously attack both the insulating material overlying the control gate and the film within these substantially vertical cavities. Since this film preferably has a very high etching rate, the etchant will rapidly diffuse (vertically as well as horizontally) through these cavities, reaching the floating gate via the cavities before reaching and ultimately removing the control gate via the layers overlying the control gate. Thus, any etchant applied in an attempted deprocessing of a memory cell containing these cavities will expose and discharge the floating gate before the control gate can be removed

BRIEF DESCRIPTION OF THE DRAWINGS

These and other features, aspects, and advantages of the present invention will become better understood with regard to the following description, appended claims, and drawings where:

DETAILED DESCRIPTION OF THE PREFERRED EMBODIMENTS

Figure 2:
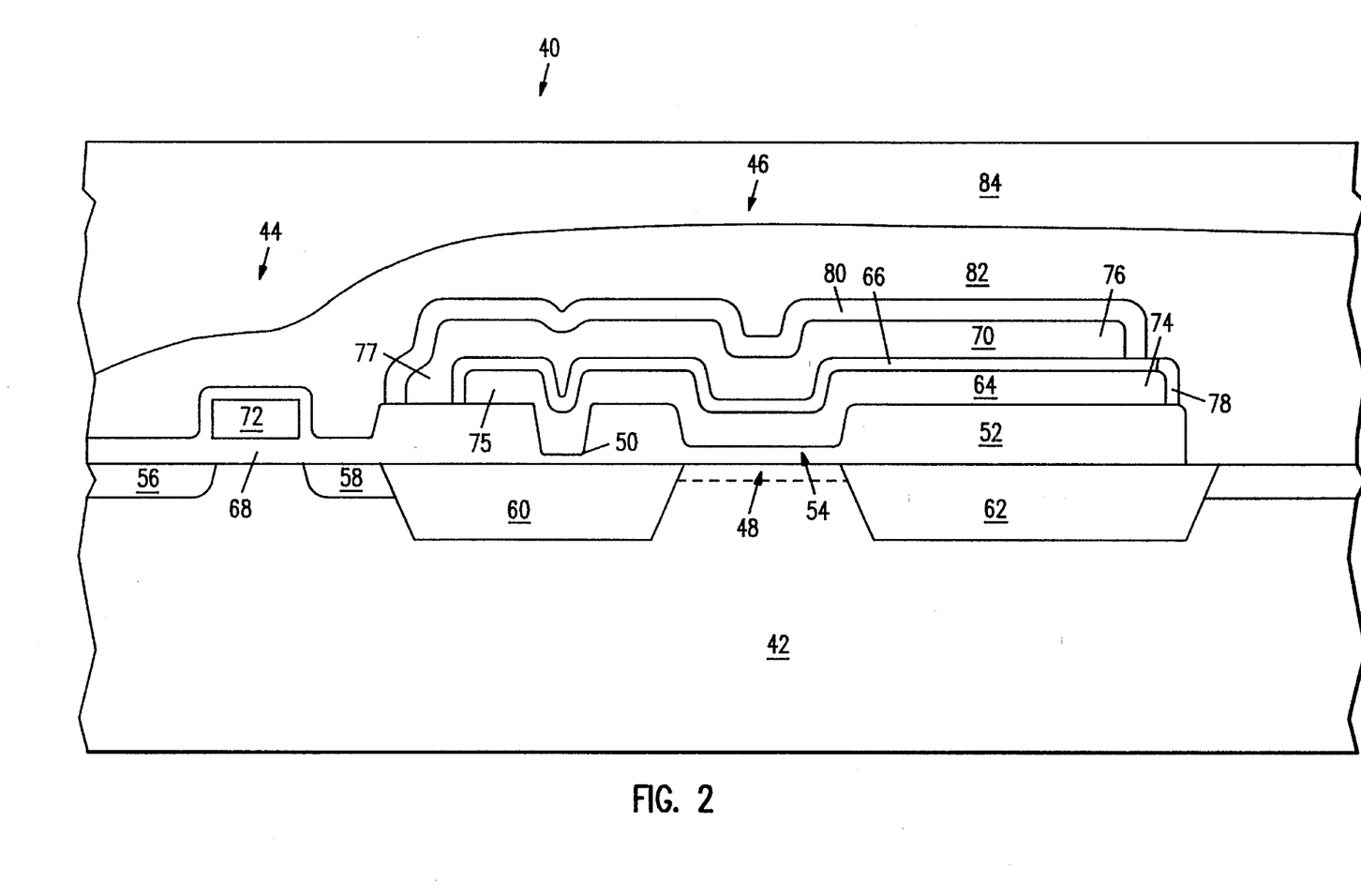
FIG. 2 is a cross sectional view of an EEPROM cell in accordance with one embodiment of the present invention.
Figure 3:
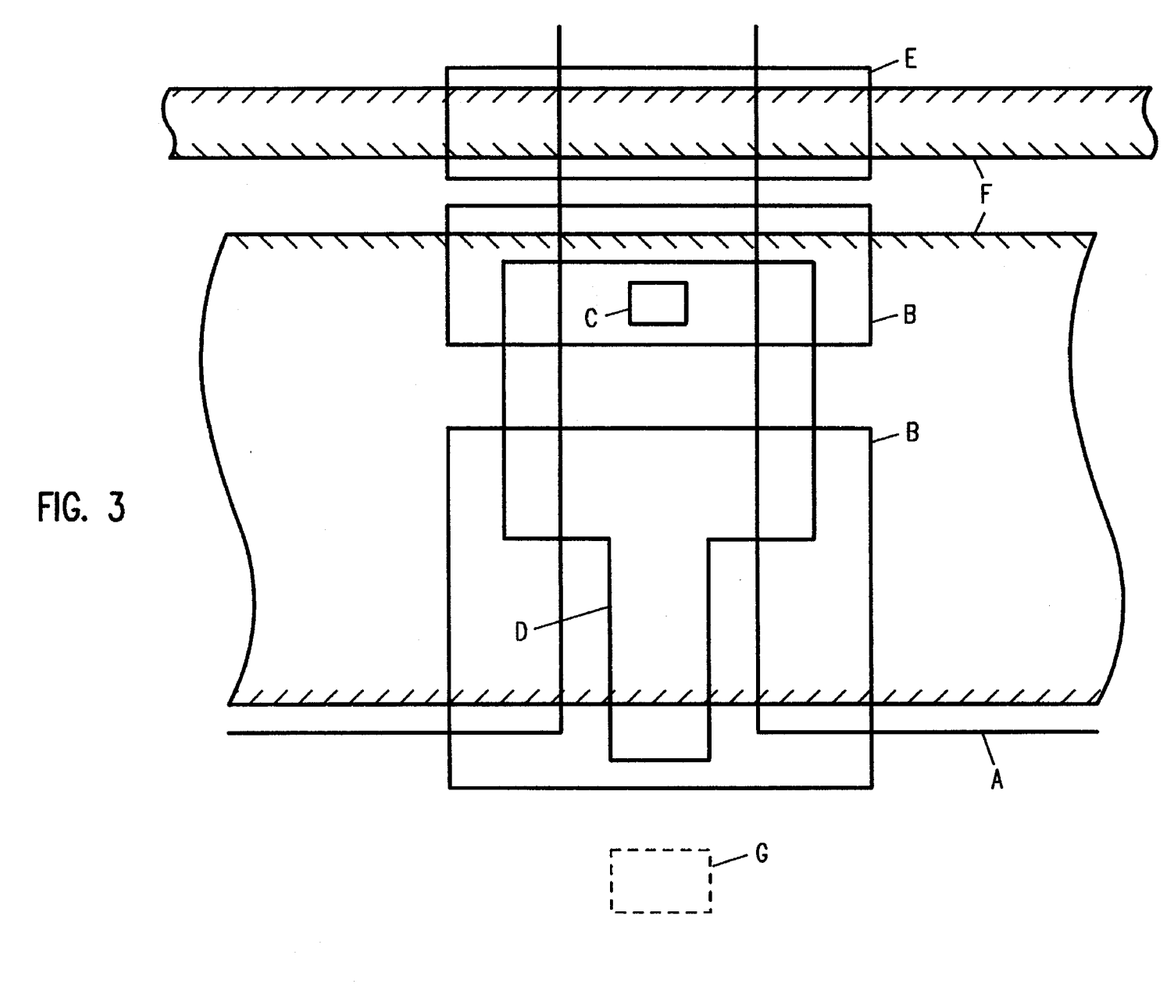
FIG. 3 is a plan view of an EEPROM cell shown in FIG. 2.

FIG. 2 shows an EEPROM memory cell in accordance with a preferred embodiment of the present invention. The reading, erasing, and programming operations of cell 40 are similar to those of conventional EEPROM cells and hence will not be described below. Cell 40 is provided on substrate 42 and includes select transistor 44 and storage transistor 46. Referring also to FIG. 3, composite masking layer A and a P-type masking layer (not shown) are used to dope substrate 42 with a P-type dopant. Although substrate 42 is shown as a separate body, it could be part of a larger semiconductor body. In another embodiment, substrate 42 may also comprise a P-type well region formed as part of a larger CMOS structure.

A thick electrically insulating field region 52 having a thickness between 400–500 nm is formed along the surface of substrate 42. Although field region 52 is preferably silicon dioxide, field region 52 may be any other suitable insulating material. Masking layer B, along with tunnel mask C, is used to define channel region 48 and tunneling window 50, as well as junction areas 60 and 62 (which will become source and drain regions, respectively). Gate oxide layer 54, continuous with field region 52, is provided along the surface of substrate 42 above channel region 48. Gate oxide layer 54 is approximately 40 nm thick. A very thin tunnel oxide layer (8.3 nm thick) continuous with field region 52 is provided in tunneling region 50.

Heavily doped N-type source 56 and drain 58 regions formed in substrate 42 provide a conductive path for select transistor 44. In a similar manner, heavily doped N-type source 60 and drain 62 regions, along with channel region 48, form storage transistor 46. It is to be noted that cell 40 could also be formed in an N-type substrate wherein the polarities discussed would be reversed.

A first layer of polycrystalline silicon (polysilicon) approximately 270 nm thick is deposited on the upper surface of field region 52. The first polysilicon layer, which later becomes floating gate 64, extends over and substantially follows the contours defined by field region 52 and gate oxide layer 54. A electrically insulating layer 66 is provided on the upper surface of polysilicon layer 64. Layer 66 is preferably a silicon dioxide/silicon nitride/silicon dioxide (ONO) sandwich having a thickness of approximately 25 nm. Masking layer D is then used to define floating gate 64.

High voltage gate oxide layer 68 is grown on the surface of substrate 42 between source 56 and drain 58 of select transistor 44. Masking layer E is then used to dope gate oxide layer 68 so as to increase the threshold voltage of select transistor 44.

A second polysilicon layer, which will become control gate 70 and select gate 72, is deposited on the upper surface of the structure. After doping the second polysilicon layer, masking layer F is used to define control gate 70 and select gate 72. In the embodiment of FIG. 2, end 77 of control gate 70 extends over and laterally surrounds end 75 of floating gate 64.

Figure 4:
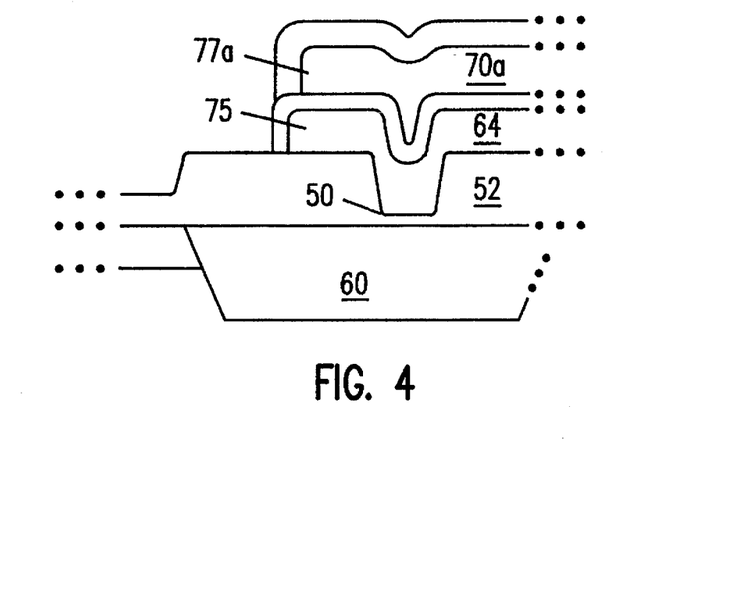
FIG. 4 is a cross sectional view of a portion of an EEPROM cell in accordance with another embodiment of the present invention.

In another embodiment shown in FIG. 4, floating gate 64 is self aligned with control gate 70a such that end 75 of floating gate 64 is substantially flush with end 77a of control gate 70a. Note that the embodiment of FIG. 4 is identical in all respects to cell 40 of FIG. 2 except for end portion 77a of control gate 70a.

Referring again to the embodiment shown in FIG. 2, control gate 70 is etched in such a manner so as to leave a sliver region 74 of floating gate 64 protruding laterally beyond edge 76 of control gate 70. Sliver region 74 extends approximately one micron beyond edge 76 of control gate 70. Preferably, the length of sliver region 74 should be as minimal as modern photolithographic techniques allow.

After this etching step, seal oxide 78 is grown around sliver region 74 of floating gate 64 to replace portions of ONO layer 66 near sliver region 74 of floating gate 64 dissipated during the etching of control gate 70. Electrically insulating layer 80 may then be provided over control gate 70, followed by overlying successive layers of insulating glass 82 and 84. In one embodiment, for instance, glass layer 82 is formed of borophosphosilicate glass (BPSG) and glass layer 84 is formed of phosphosilicate glass (PSG).

Sliver region 74 described above provides protection against an attempted deprocessing of cell 40 using, for example, a chemical or plasma etching process as follows. In order to detect whether any charge is stored on floating gate 64, one must first gain access to floating gate 64 by removing control gate 70 (as well as insulating layers 66, 80). During such an attempted deprocessing, after removal of glass layers 82, 84, upon application of an etchant to remove insulating layer 80, the etchant will simultaneously eat through seal oxide 78 and the very thin ONO layer 66 over sliver region 74, thereby exposing sliver region 74 of floating gate 64 well before control gate 70 is etched through because insulating layer 80 is much thicker than ONO layer 66 and seal oxide 78. Ions present in the etchant will, upon contact with floating gate 64, immediately dissipate any charge stored on floating gate 64 thereby "erasing" floating gate 64. Thus, sliver region 74 prevents one from determining what the correct binary state of cell 40 was prior to the attempted deprocessing.

Figure 5:
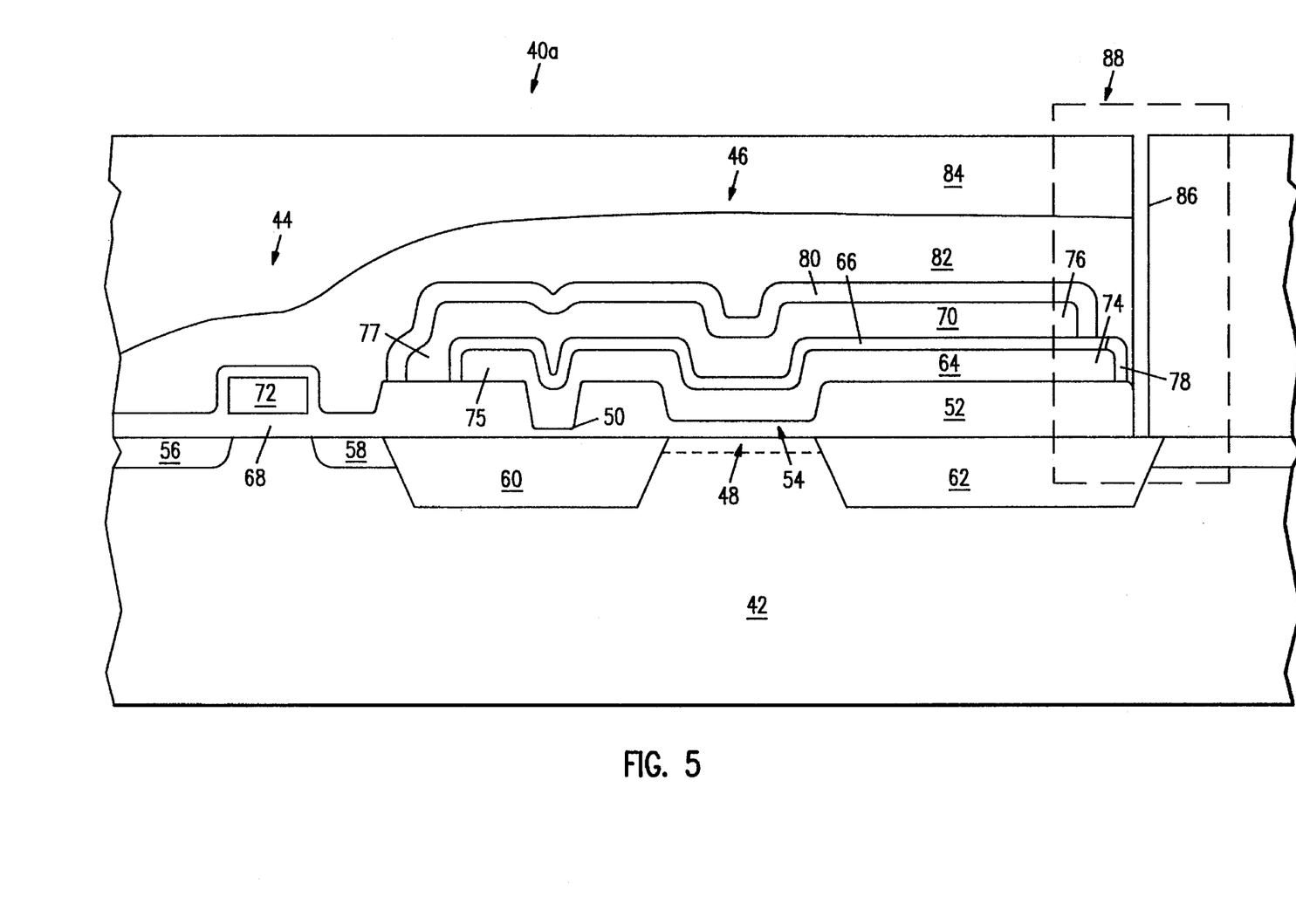
FIG. 5 is cross sectional view of an another embodiment of the present invention.

FIG. 5 shows another embodiment of the present invention. The reading, writing, and erasing operations of cell 40a are identical in all respects to those of cell 40 shown in FIG. 2, and the description above relating to the embodiment of FIG. 2 applies equally to the embodiment of FIG. 5. Accordingly, those features in common to the embodiments of FIG. and 5 are denoted with the same numerals.

Referring to FIG. 3 as well is to FIG. 5, masking layer G is used either after (1) glass layer 82 is deposited or (2) after insulating layer 66 is formed to etch one or more cavities 86 in cell 40a. Preferably, each cavity 86 is one micron in diameter and extends in a substantially vertical direction in a region proximate to floating gate 64. Cavities 86 are not limited to a cylindrical shape, but may have a rectangular, octagonal, or any other suitable cross section.

After having been etched, cavities 86 are completely filled with a film 87 having a very high etching rate. This film 87 may be, for instance, an 8% phosphorous doped oxide film, or any other suitable material having an etching rate faster than that of the insulating material overlying the control gate. Referring to FIG. 5, cavities 86 provide protection against the external detection of charge stored on floating gate 64 as follows. As mentioned earlier, in order to gain access to and detect any charge stored on floating gate 64, one must first remove control gate 70. During such a deprocessing using, for example, a plasma or chemical etching process, the etchant will simultaneously attack glass layer 84 and a top portion of cavities 86. While glass layers 84, 82 and insulating layer 80 have a relatively slow etching rate, cavities 86, as mentioned earlier, are filled with a film 87 having a very high etching rate. The etchant etches not only down through the film 87 but to an extent laterally into the glass layers 84, 82 as the film 87 is etched downward, i.e., etching takes place both vertically and horizontally. Because the etching rate of the film 87 is greater than that of the glass layers 82, 84, the etchant will reach seal oxide 78 and etch therethrough to floating gate 64 prior to control gate 70 being removed. Hence any charge once present on floating gate 64 will be dissipated by the etchant before the etchant removes control gate 70. In other words, etchant deprocessing is ineffective for determining the binary state of cell 40a because the etchant will erase floating gate 64 before exposing control gate 70 for removal.

Figure 6:
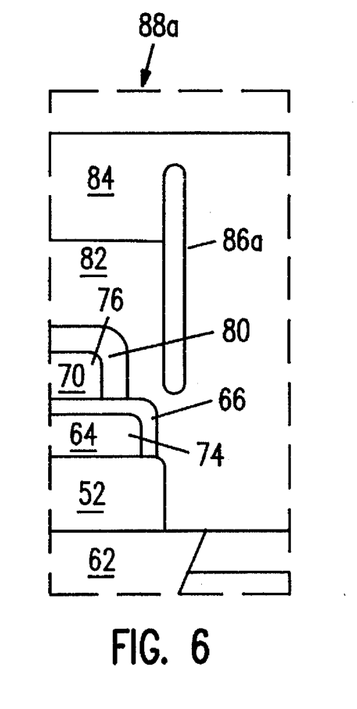
FIGS. 6–9 are partial cross sectional views of other embodiments of the present invention.

Cavities 86 are shown in FIG. 5 to extend from a top surface of cell 40a to substrate 42 for purposes of clarity only. Indeed, the precise positioning and length of cavities 86 within outlined portion 88 of cell 40a may vary depending upon the specific characteristics of the EEPROM cell. Cavities 86 should preferably be placed as close to floating gate 64 as possible and should extend in an upward direction (i.e., towards the top surface of the EEPROM cell) and in a downward direction (i.e., towards substrate 42) a predetermined length sufficient to ensure that any etchant applied in an attempted deprocessing will reach and expose floating gate 64 via cavities 86 before exposing control gate 70 via electrically insulating layer 80. FIG. 6 shows one such possible positioning of cavities 86a, i.e., not extending to the top surface of cell 40a or to the substrate 42. Note that the various features of the embodiments of FIGS. 6–9 common with those of FIG. 5 are appropriately labelled with the same numbers.

Figure 7:
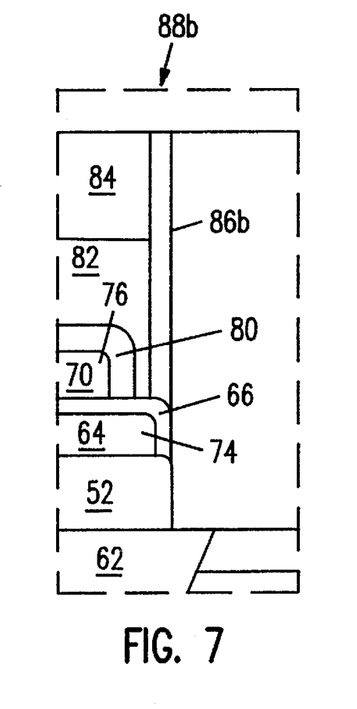

In another embodiment cavities 86b may overlap floating gate 64 so as to be above a portion of sliver region 74 of floating gate 64, as shown in FIG. 7.

Figure 8:
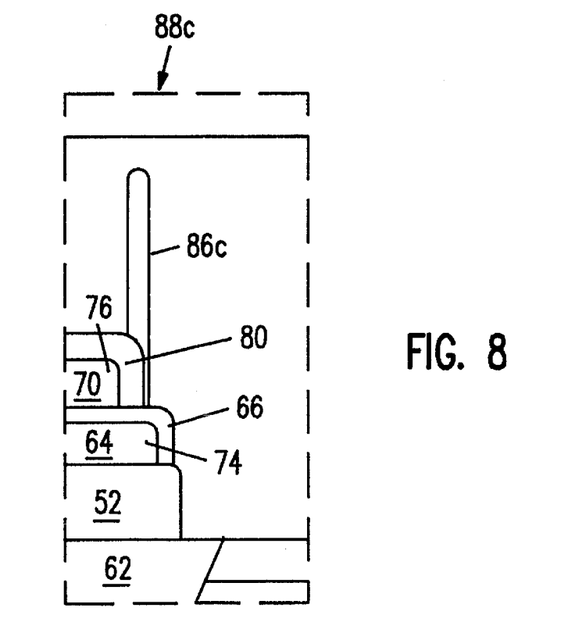

In yet another embodiment shown in FIG. 8, cavities 86c may be formed so as to overlap a portion of control gate 70.

The structure of sliver region 74 described above and shown in FIG. 5 provides additional security against charge detection via cell deprocessing. Sliver region 74 extends beyond end 76 of control gate 70 towards cavities 86, thereby reducing the distance between cavities 86 and floating gate 64. Accordingly, during an attempted deprocessing of cell 40a, the etchant will reach floating gate 64 via cavities 86 in even less time.

Figure 9:
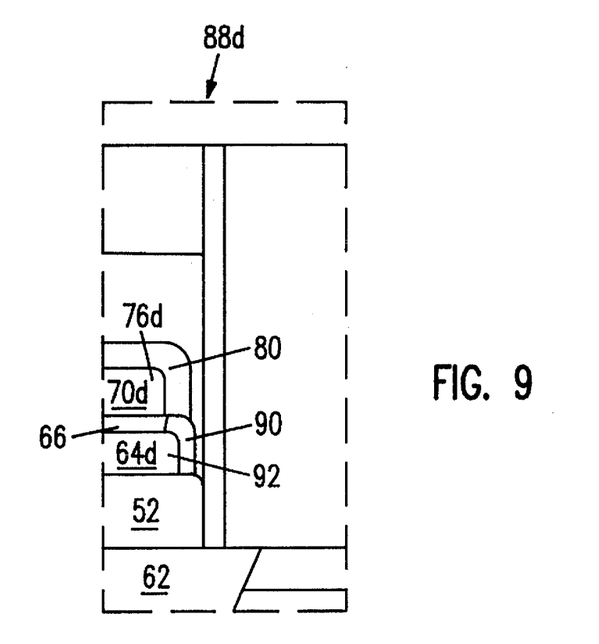

In another embodiment shown in FIG. 9 floating gate 64d is self aligned with control gate 70d. In the embodiment of FIG. 9, control gate 70d is etched in such a manner so as to remove portions of ONO layer 66 and floating gate 64d which extend beyond edge 76d of control gate 70d. A thin layer of seal oxide 90 is then thermally grown around edge 92 of floating gate 64d to replace portions of ONO layer 66 removed during the etching process. This self-aligning etching process results in edge 92 of floating gate 64d and edge 76d of control gate 70d being substantially flush with respect to one another. In one embodiment, seal oxide 92 has a relatively high etching rate so as to increase the speed with which the etchant eating through cavities 86 reaches and discharges floating gate 64d. The cavities 86 shown in the embodiment of FIG. 9 are formed in the same manner as are cavities 86 shown in the embodiment of FIG. 5, and may be of various lengths and widths and may be positioned in various regions adjacent floating gate 64d as described earlier and illustrated in FIGS. 6–8.

In addition to providing protection against etchant deprocessing as described above, the topological structure of the embodiments described above also provide an inherent protection against cell deprocessing via mechanical grinding. Insulating layer 66 is formed to have a thickness of approximately 25 nm. Using the embodiment of FIG. 2 as an example, since precision grinding in such a small resolution range is very difficult, if not impossible, control gate 70 cannot be ground and removed without simultaneously damaging insulating layer 66 and floating gate 64. Exposure of floating gate 64 to ions necessarily present in grinding solutions will result in the discharge of floating gate 64 and, thus, an attempted detection of the binary state of cell 40 via mechanical grinding will yield an "erased" state.

The features of particular embodiments described above, which provide a heightened security against the external detection of binary data storage, will not degrade cell performance with regard to programming and erasing ability, data retention, or yield potential.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A semiconductor device comprising:
    a semiconductor substrate having a source, a drain, and a channel region extending between said source and drain;
    a first electrically insulating layer overlying said substrate;
    a floating gate overlying said first electrically insulating layer;
    a second electrically insulating layer overlying said floating gate;
    a control gate overlying said second insulating layer;
    a third insulating layer overlying said control gate; and
    a cavity formed in said third insulating layer, said cavity having a first end positioned in a region proximate to an end of said floating gate and extending, in a direction away from said substrate, beyond said control gate, wherein said cavity is substantially filled with a film having a higher etching rate than the third insulating layer such that an etchant applied to said semiconductor device in an attempted deprocessing of said semiconductor device will expose and discharge said floating gate before exposing said control gate.

2. The structure of claim 1 wherein said first electrically insulating layer further comprises a first region positioned over said source, a second region positioned over said drain, and a third region positioned over said channel region, said third region being thinner than said first and second regions.

3. The structure of claim 1 wherein an end of said control gate is substantially flush with said end of said floating gate.

4. The structure of claim 1 wherein said end of said floating gate further comprises a sliver region, said sliver region extending beyond an end of said control gate.

5. The structure of claim 4 wherein said sliver region extends approximately one micron or less beyond the end of the control gate.

6. The structure of claim 1 wherein another end of said control gate is substantially flush with another end of said floating gate.

7. The structure of claim 1 wherein another end of said control gate extends over and laterally surrounds another end of said floating gate.

8. The structure of claim 1 wherein said cavity extends to said top surface of said semiconductor device.

9. The structure of claim 1 wherein said cavity extends to said substrate.

10. The structure of claim 1 wherein a portion of said cavity extends over said floating gate.

11. The structure of claim 1 wherein a portion of said cavity extends over said control gate.

12. The structure of claim 1 wherein the third insulating layer comprises a glass layer.

13. A semiconductor device comprising:

a semiconductor substrate having a source, a drain, and a channel region extending between said source and drain;

a first electrically insulating layer overlying said substrate;

a floating gate overlying said first electrically insulating layer and having at one end thereof a sliver region;

a second electrically insulating layer overlying said floating gate; and a control gate overlying said second insulating layer, wherein said sliver region of said floating gate extends approximately one micron or less beyond an end of said control gate such that an etchant applied to said semiconductor device in an attempted deprocessing of said semiconductor device will expose and discharge said floating gate before exposing said control gate.

14. The structure of claim 13 wherein said first electrically insulating layer further comprises a first region positioned over said source, a second region positioned over said drain, and a third region positioned over said channel region, said third region being thinner than said first and second regions.

15. The structure of claim 13 wherein another end of said control gate is substantially flush with another end of said floating gate.

16. The structure of claim 13 wherein another end of said control gate extends over and laterally surrounds another end of said floating gate.

17. The structure of claim 13 further comprising a third electrically insulating layer overlying said control gate.

18. The structure of claim 17 further comprising one or more layers of glass overlying said third electrically insulating layer.

19. The structure of claim 13 wherein said second electrically insulating layer comprises a combination of silicon dioxide and silicon nitride.

* * * * *